(12) United States Patent
Motomochi

(10) Patent No.: US 7,379,349 B2
(45) Date of Patent: May 27, 2008

(54) SIMULTANEOUS AND SELECTIVE MEMORY MACRO TESTING

(75) Inventor: Kenji Motomochi, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 721 days.

(21) Appl. No.: 10/891,041

(22) Filed: Jul. 15, 2004

(65) Prior Publication Data

US 2005/0015690 A1    Jan. 20, 2005

(30) Foreign Application Priority Data

Jul. 15, 2003    (JP)    ............... 2003-274652

(51) Int. Cl.
*G11C 7/10* (2006.01)
*G11C 7/00* (2006.01)
(52) U.S. Cl. ............ 365/189.04; 365/201; 365/230.03
(58) Field of Classification Search ........... 365/185.11, 365/189.04, 191, 201, 230.03
See application file for complete search history.

(56) References Cited

U.S. PATENT DOCUMENTS 5,959,911 A * 9/1999 Krause et al. .............. 365/201

6,601,199 B1 * 7/2003 Fukuda et al. .............. 714/719
7,176,560 B2 * 2/2007 Motomochi .................. 257/686

FOREIGN PATENT DOCUMENTS

| JP | 02-015490 | 1/1990 |
|----|-----------|--------|
| JP | 03-058375 | 3/1991 |
| JP | 07-307100 | 11/1995 |
| JP | 11-231023 A | 8/1999 |
| JP | 2000-133000 | 5/2000 |
| JP | 2001-101900 | 4/2001 |

OTHER PUBLICATIONS

Japanese Office Action issued in Japanese Patent Application No. 2003-274652, mailed Apr. 24, 2007.

* cited by examiner

*Primary Examiner*—Richard T. Elms
*Assistant Examiner*—Alexander Sofocleous
(74) *Attorney, Agent, or Firm*—McDermott Will & Emery LLP

(57) ABSTRACT

A semiconductor device includes: a plurality of memory macros, each of which includes a plurality of memory cells, is activated in accordance with a corresponding active macro selection signal, and operates in an active mode according to a corresponding active mode control signal; and a control unit for generating and outputting, in accordance with an input operation mode control signal, the active macro selection signals and the active mode control signals that correspond to the respective memory macros, so that two or more of the memory macros are activated simultaneously.

15 Claims, 12 Drawing Sheets

FIG. 6

| MC2 | MC1 | MC0 | NUMBER OF SIMULTANEOUSLY ACTIVATED MACROS |
|---|---|---|---|
| L | L | L | 1 |
| L | L | H | 2 |
| L | H | L | 3 |
| L | H | H | 4 |
| H | L | L | 6 |
| H | L | H | 12 |
| H | H | L | 1 |
| H | H | H | 1 |

FIG. 9

| | REGULAR-MODE ACTIVE MACRO SELECTION SIGNAL | | SIMULTANEOUSLY ACTIVE MACRO SELECTION SIGNAL | |
|---|---|---|---|---|
| MEMORY MACRO10 | BSEL0 | MSEL0 | M_BSEL0 | M_MSEL0 |
| MEMORY MACRO11 | BSEL0 | MSEL1 | M_BSEL0 | M_MSEL1 |
| MEMORY MACRO12 | BSEL0 | MSEL2 | M_BSEL0 | M_MSEL2 |
| MEMORY MACRO13 | BSEL0 | MSEL3 | M_BSEL0 | M_MSEL3 |
| MEMORY MACRO14 | BSEL1 | MSEL0 | M_BSEL1 | M_MSEL0 |
| MEMORY MACRO15 | BSEL1 | MSEL1 | M_BSEL1 | M_MSEL1 |
| MEMORY MACRO16 | BSEL1 | MSEL2 | M_BSEL1 | M_MSEL2 |
| MEMORY MACRO17 | BSEL1 | MSEL3 | M_BSEL1 | M_MSEL3 |
| MEMORY MACRO18 | BSEL2 | MSEL0 | M_BSEL2 | M_MSEL0 |
| MEMORY MACRO19 | BSEL2 | MSEL1 | M_BSEL2 | M_MSEL1 |
| MEMORY MACRO20 | BSEL2 | MSEL2 | M_BSEL2 | M_MSEL2 |
| MEMORY MACRO21 | BSEL2 | MSEL3 | M_BSEL2 | M_MSEL3 |

SIMULTANEOUS AND SELECTIVE MEMORY MACRO TESTING

CROSS-REFERENCE TO RELATED APPLICATION

This application is related to Japanese Patent Application No. 2003-274652 filed on Jul. 15, 2003, whose priority is claimed under 35 USC §119, the disclosure of which is incorporated herein by reference in its entirety.

BACKGROUND OF THE INVENTION

The present invention relates to semiconductor devices which include a plurality of memory macros each having a plurality of memory cells.

Semiconductor devices have been continuously achieving higher performance and greater functionality. Development of system LSIs, in which various kinds of function blocks each having a specific function are mounted on a single chip so that the single chip realizes a highly sophisticated function, has been rapidly proceeding today.

FIG. 12 is a block diagram illustrating an exemplary configuration of a conventional semiconductor device. The semiconductor device 900 of FIG. 12 is a system LSI and includes memory macros 911, 912, 913, and 914 and a memory macro control circuit 930.

Control signals ZI are input to the memory macro control circuit 930 from a device external to the semiconductor device 900. Via an all-macro common signal bus which transmits common signals to all of the memory macros, the memory macro control circuit 930 outputs an all-macro common signal ZA to the memory macros 911 through 914. The memory macro control circuit 930 also outputs active-macro selection signals ZB1, ZB2, ZB3, and ZB4 that correspond to the respective memory macros 911 through 914 and activate the corresponding memory macros 911 through 914.

The all-macro common signal ZA contains an address signal for selecting a specific memory cell within each memory macro, a read/write operation control signal, write-in data and the like. Although a read-out data bus for transmitting data read out from the memory macros and various kinds of other function blocks are incorporated in the semiconductor device 900, illustration of those members is omitted in FIG. 12.

Hereinafter, it will be explained how the conventional semiconductor device 900 configured in this manner operates. The memory macro control circuit 930 is controlled by the control signals ZI, and generates the signals in the all-macro common signal ZA and the active-macro selection signals ZB1 through ZB4 so as to activate a specific one of the memory macros 911 through 914.

The all-macro common signal, which is common to all of the memory macros, is transmitted by the all-macro common signal bus. At the same time, for example, in a case where the memory macro 911 is activated, only the active-macro selection signal ZB1 of the active-macro selection signals ZB1 through ZB4 goes to the "H" level, while the active-macro selection signals ZB2 through ZB4 go to the "L" level ("H" and "L" indicate logical states.)

Each memory macro accepts the all-macro common signal only when the input active-macro selection signal is at the "H" level. In this case, only the memory macro 911 accepts the all-macro common signal and operates, while the other memory macros 912 through 914 do not operate even if the all-macro common signal is input to them. In cases where another memory macro is activated, only one of the memory macros operates as in the case of the memory macro 911.

As described above, in the semiconductor device 900, two or more of the memory macros are not activated at the same time, and only one of them is activated.

A related technique is disclosed in Japanese Laid-Open Publication No. 11-231023.

However, if a semiconductor device incorporating a plurality of memory macros is designed so that only one of the memory macros is activated, the memory macros have to be activated one by one in order to activate all of the memory macros. Therefore, a problem is caused in that as the number of memory macros incorporated into the semiconductor device rises, time required for a test or the like, such as time required for a burn-in process for removing initial degradation, a non-defective item selecting process, and a reliability evaluation process, also increases.

SUMMARY OF THE INVENTION

It is therefore an object of the present invention to reduce time required for a test or the like of a semiconductor device having a plurality of memory macros.

More specifically, an inventive semiconductor device includes: a plurality of memory macros, each of which includes a plurality of memory cells, is activated in accordance with a corresponding active macro selection signal, and operates in an active mode according to a corresponding active mode control signal; and a control unit for generating and outputting, in accordance with an input operation mode control signal, the active macro selection signals and the active mode control signals that correspond to the respective memory macros, so that two or more of the memory macros are activated simultaneously.

In the inventive semiconductor device, specific memory macros can be activated at the same time. Therefore, time required for a test or the like, such as time required for a burn-in process, a non-defective item selecting process, and a reliability evaluation process, is decreased.

In the semiconductor device, the control unit preferably determines a test mode of the semiconductor device as a first operation mode in accordance with the operation mode control signal.

Then, the test mode of the semiconductor device can be determined in accordance with the operation mode control signal. The test mode indicates a mode in which only one of the activated memory macros produces an output or a mode in which two or more of the activated memory macros produce outputs.

In the semiconductor device, the control unit preferably determines, in accordance with the operation mode control signal, an operation mode that corresponds to the number of the simultaneously activated memory macros, as a second operation mode.

Then, the number of the simultaneously activated memory macros can be selectively determined in accordance with the operation mode control signal.

In the semiconductor device, in activating the simultaneously activated memory macros in an identical active mode, the control unit preferably selects the simultaneously activated memory macros based on, of all signals that form a memory macro selection address signal used for memory macro selection, one or more signals other than signals that have been selected from the highest toward lowest order by the number corresponding to the number of the simultaneously activated memory macros.

Then, some of the signals forming the memory macro selection address signal do not have to be considered.

In the semiconductor device, a first operation mode control signal that indicates a test mode and a second operation mode control signal that indicates the number of memory macros to be activated simultaneously are preferably input as the operation mode control signal into the control unit; and the control unit preferably determines a test mode of the semiconductor device as a first operation mode in accordance with the first operation mode control signal, determines, in accordance with the second operation mode control signal, an operation mode that corresponds to the number of the simultaneously activated memory macros, as a second operation mode, and determines an operation mode of the entire semiconductor device based on a combination of the first and second operation modes.

Then, the first and second operation mode control signals can be set individually, which allows many operation modes to be established for the entire semiconductor device.

Some of logical combinations that the first and second operation mode control signals indicate preferably correspond as the operation mode of the entire semiconductor device to a given reference operation mode.

Then, when some of the logical combinations of the first and second operation mode control signals do not have to be used, the reference operation mode can be assigned to those combinations. Since operation modes can be assigned to all of the logical combinations of the first and second operation mode control signals, situations in which the semiconductor device stops operation or operates in an unknown operation mode can be prevented.

The reference operation mode is preferably an operation mode in which the semiconductor device under normal usage operates.

Then, the operation mode at the time of the normal usage, in which only one of the memory macros is activated, is used as the reference operation mode, which allows the semiconductor device to perform normal read operation or other operation.

The semiconductor device preferably further includes an output data transmitting unit for obtaining and outputting output data that corresponds to the first operation mode, based on data read out from one or more of the plurality of memory macros.

Then, with the one output data transmitting unit, data which is different in meaning and content can be transmitted in accordance with the operation mode of the entire semiconductor device.

The output data transmitting unit preferably obtains the output data in accordance with the first operation mode, based on data that indicates whether or not data bits read out from two or more of the plurality of memory macros all match with each other, or based on a data bit read out from one of the plurality of memory macros.

Then, bus wiring for output data does not have to be divided based on the operation modes of the semiconductor device and the one output data transmitting unit can be used in all of the operation modes of the semiconductor device. Accordingly, the circuitry is simplified and the chip area is thus reduced.

The output data transmitting unit preferably includes a plurality of stages of match determination circuits, in which the match determination circuits each determine whether or not data bits input therein match with each other.

Then, the number of output data buses can be reduced stepwise, such that the circuitry is simplified and the chip area is decreased.

The output data transmitting unit preferably includes, as the match determination circuits, a plurality of first match determination circuits and a plurality of second match determination circuits; the output data transmitting unit preferably further includes a plurality of first AND circuits and a second AND circuit; each of the first match determination circuits preferably determines whether or not data bits output from corresponding memory macros of the plurality of memory macros match with each other, and outputs a result of the determination; each of the first AND circuits preferably obtains and outputs a logical product of the outputs produced from corresponding first match determination circuits of the plurality of first match determination circuits; each of the second match determination circuits preferably determines whether or not the outputs produced from corresponding first AND circuits of the plurality of first AND circuits match with each other, and outputs a result of the determination; and the second AND circuit preferably obtains a logical product of the outputs produced from the second match determination circuits and outputs the logical product as the output data.

Then, the number of output data buses can be reduced further, which allows a simplification of the circuitry and a reduction in the chip area.

The first match determination circuits preferably use the outputs produced respectively from the memory macros of the plurality of memory macros that correspond to the first match determination circuits, in accordance with the active mode control signals that correspond to the respective memory macros.

Then, the outputs from the memory macros for use in the first match determination circuits can be selected in accordance with the active mode control signals.

The output data transmitting unit preferably obtains the output data based on one or more data bits read out from one or more memory macros each of which has been selected by a corresponding one of the active mode control signals from the plurality of memory macros.

Then, it is possible to read out and output data from the memory macro(s) selected in accordance with the respective active mode control signal(s).

The output data transmitting unit preferably includes a data output circuit for determining whether or not logical states of three or more signals match with each other and outputting a result of the determination; the data output circuit preferably includes a plurality of two-input match determination circuits, each of which determines whether or not logical states of two signals match with each other and outputs a result of the determination; and signals that are in an identical logical state are preferably input into two of the two-input match determination circuits.

Then, even in cases where data is input from an odd number of memory macros into the output data transmitting unit, whether or not the data bits read out from the respective memory macros match with each other is easily determined by using the two-input match determination circuits.

The two-input match determination circuits are preferably exclusive OR circuits.

According to the present invention, specific memory macros can be activated at the same time. Thus, time required for a test or the like, such as time required for a burn-in process, a non-defective-item selecting process, and a reliability evaluation process, is decreased. Accordingly, time required for a test or the like of LSIs including a large capacity memory, in particular, is reduced significantly.

BRIEF DESCRIPTION OF THE DRAWINGS

FIG. 6 is a view indicating relationship between active-macro-number designating signals MC0 through MC2 and the number of memory macros that are activated simultaneously.

FIG. 9 is a view illustrating regular-mode active macro selection signals and simultaneously active macro selection signals that correspond to memory macros.

DESCRIPTION OF THE PREFERRED EMBODIMENTS

Hereinafter, preferred embodiments of the present invention will be described with reference to the accompanying drawings.

Figure 1:
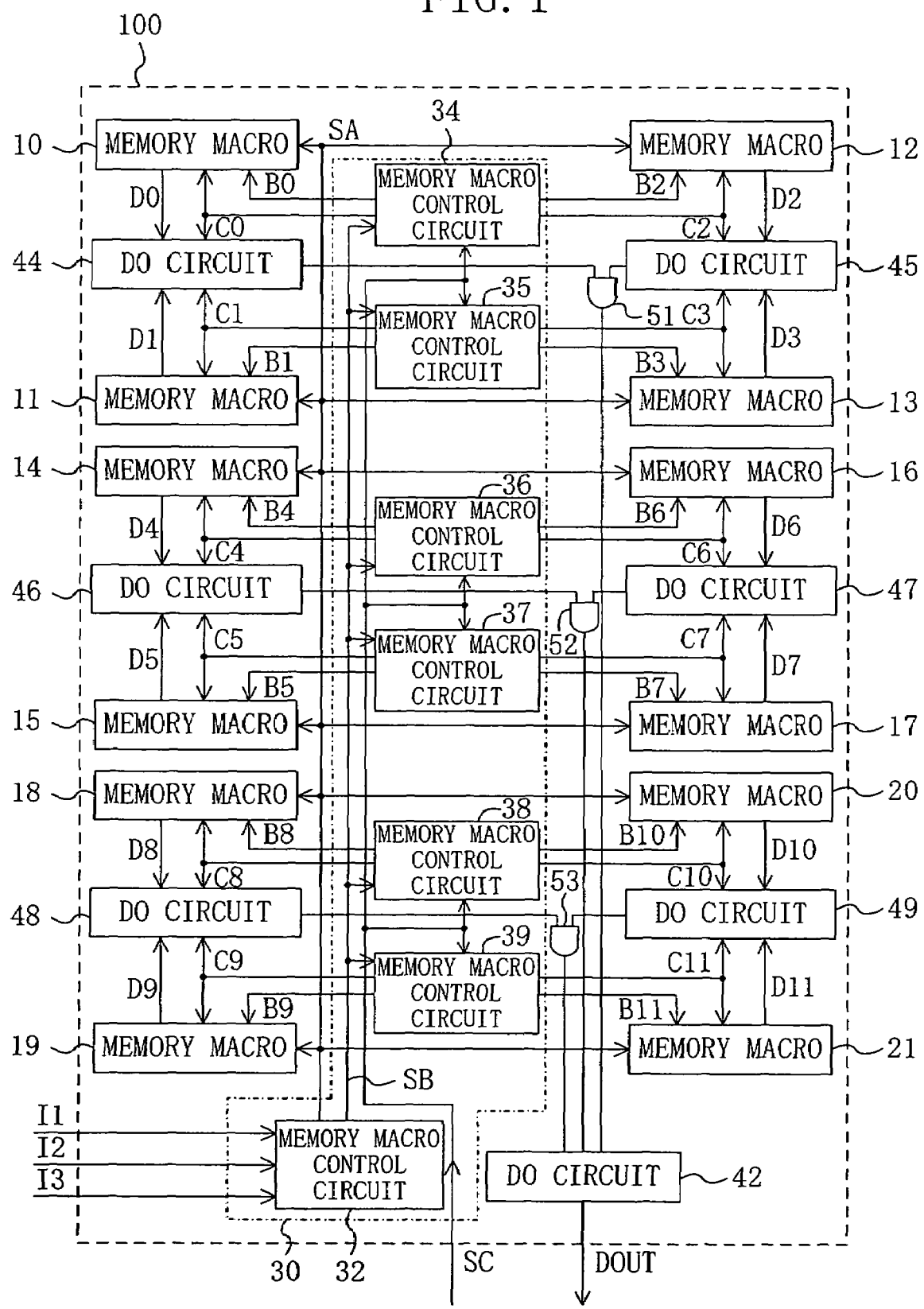
FIG. 1 is a block diagram illustrating an exemplary configuration of a semiconductor device in accordance with an embodiment of the present invention.

FIG. 1 is a block diagram illustrating an exemplary configuration of a semiconductor device in accordance with an embodiment of the present invention. The semiconductor device 100 of FIG. 1 includes memory macros 10, 11, 12, 13, 14, 15, 16, 17, 18, 19, 20, and 21, a control unit 30, first data output circuits 44, 45, 46, 47, 48, and 49, a second data output circuit 42, and AND gates (first AND circuits) 51, 52, and 53. The control unit 30 includes a first memory macro control circuit 32 and second memory macro control circuits 34, 35, 36, 37, 38, and 39. Although the semiconductor device 100, which is a system LSI, includes various function blocks other than these, description thereof will be omitted herein.

The data output circuits (DO circuits) 42 and 44 through 49 and the AND gates 51 through 53 form an output data transmitting unit. The memory macros 10 through 21 each include a plurality of memory cells and are configured in the same manner.

A first operation mode control signal I1, a second operation mode control signal I2, and an input signal I3 are input to the memory macro control circuit 32 from device(s) external to the semiconductor device 100. The first operation mode control signal I1 contains a test mode designating signal CMPT and a test mode fixing signal BISTMODE.

The second operation mode control signal I2 contains active-macro-number designating signals MC0, MC1, and MC2. The input signal I3 includes an address signal, write-in data and the like. In the address signal, the higher-order four bits, for example, form a memory macro selection address signal I3A for selecting memory macro(s), while the other bits form an address signal I3B for selecting a specific memory cell within the memory macro(s).

The memory macro control circuit 32 outputs an all-macro common signal SA to the memory macros 10 through 21 via an all-macro common signal bus. The all-macro common signal SA contains the address signal I3B, the write-in data and the like.

The memory macro control circuit 32 generates a macro selection signal SB based on the first and second operation mode control signals I1 and I2 and the memory macro selection address signal I3A, and outputs the macro selection signal SB to the memory macro control circuits 34 through 39. A control signal SC is input to the memory macro control circuits 34 through 39 from a device external to the semiconductor device 100.

The memory macro control circuit 34 controls the memory macros 10 and 12, the memory macro control circuit 35 controls the memory macros 11 and 13, the memory macro control circuit 36 controls the memory macros 14 and 16, the memory macro control circuit 37 controls the memory macros 15 and 17, the memory macro control circuit 38 controls the memory macros 18 and 20, and the memory macro control circuit 39 controls the memory macros 19 and 21.

The data output circuit 44 corresponds to the memory macros 10 and 11, and the data output circuit 45 corresponds to the memory macros 12 and 13. The data output circuit 46 corresponds to the memory macros 14 and 15, and the data output circuit 47 corresponds to the memory macros 16 and 17. The data output circuit 48 corresponds to the memory macros 18 and 19, and the data output circuit 49 corresponds to the memory macros 20 and 21.

Active macro selection signals B0 through B11 correspond to the memory macros 10 through 21, respectively, and activate the respective corresponding memory macros. Active mode control signals C0 through C11 correspond to the memory macros 10 through 21, respectively, and control active modes of the respective corresponding memory macros. The active mode control signals C0 through C11 are each composed of a write/read operation control signal, a read-out data output control signal, and the like.

The active mode of each memory macro is either a regular active mode or a dummy active mode. When the memory macros 10 through 21 operate in the regular active mode, they perform normal read/write operation and output the read data externally of the memory macros. When the memory macros 10 through 21 operate in the dummy active mode, they accept the input address signal and operate read operation within the memory macros, but do not output the read data externally of the memory macros.

If the active macro selection signal B0 indicates that the memory macro 10 should be activated, the memory macro 10 performs write operation or read operation in the active mode that corresponds to the active mode control signal C0. The memory macro 10 outputs the read data to the corresponding data output circuit 44. The memory macro 10 writes the write-in data contained in the all-macro common signal SA, into an address indicated by the address signal included in the all-macro common signal SA, or reads data from this address.

The memory macros 11 through 21 can be explained in substantially the same manner as the memory macro 10, and description thereof will be thus omitted herein.

The memory macro control circuit 34 generates the active macro selection signals B0 and B2 and the active mode control signals C0 and C2 based on the macro selection signal SB and the control signal SC, and outputs the active macro selection signal B0 and the active mode control signal C0 to the memory macro 10, while outputting the active macro selection signal B2 and the active mode control signal C2 to the memory macro 12.

The memory macro control circuit 35 generates the active macro selection signals B1 and B3 and the active mode control signals C1 and C3 based on the macro selection signal SB and the control signal SC, and outputs the active macro selection signal B1 and the active mode control signal C1 to the memory macro 11, while outputting the active macro selection signal B3 and the active mode control signal C3 to the memory macro 13.

The memory macro control circuits 36 through 39 can be explained in substantially the same manner as the memory macro control circuits 34 and 35, and description thereof will be thus omitted herein.

An operation mode of the entire semiconductor device 100 (the entire chip) of FIG. 1 is represented by a combination of first and second operation modes. When the test mode fixing signal BISTMODE is at the "H" level, the control unit 30 puts a test mode of the semiconductor device 100 to a normal test mode and determines this mode as the first operation mode.

The test mode designating signal CMPT becomes effective only when the test mode fixing signal BISTMODE is at the "L" level. When the test mode fixing signal BISTMODE and the test mode designating signal CMPT are both at the "L" level, the control unit 30 determines the normal test mode as the first operation mode. In this case, the memory macro control circuit 32 generates the macro selection signal SB so that only one of two or more memory macros that are activated at the same time operates in the regular active mode, while the other simultaneously activated memory macros operate in the dummy active mode. Data actually read out from the memory macro that operates in the regular active mode is output as output data DOUT.

When the test mode fixing signal BISTMODE is at the "L" level, and the test mode designating signal CMPT is at the "H" level, the control unit 30 determines a simple test mode as the first operation mode (except for cases in which only one memory macro is activated.) In this case, the memory macro control circuit 32 generates the macro selection signal SB so that all of the two or more memory macros that are activated at the same time operate in the regular active mode. As the output data DOUT, simple failure/no-failure determination data regarding data read out from each memory macro is output.

The output data transmitting unit obtains and outputs, in accordance with the first operation mode, the output data DOUT based on data that indicates whether or not the data sets read out from the two or more of the memory macros 10 through 21 all match with each other, or based on the data read out from the one of the memory macros 10 through 21.

More specifically, in the simple test mode, the data output circuit 44 outputs, in accordance with the active mode control signals C0 and C1, to the AND gate 51 a signal that indicates whether or not outputs produced from the corresponding memory macros 10 and 11 match with each other. In the normal test mode, the data output circuit 44 outputs to the AND gate 51 a signal that corresponds to the output produced from either the memory macro 10 or 11.

Similarly, in accordance with the corresponding active mode control signal, each of the data output circuits 45 through 49 outputs to the corresponding AND gate a signal obtained based on outputs from the corresponding memory macros.

The AND gate 51 outputs the logical product of the outputs from the data output circuits 44 and 45 to the data output circuit 42. The AND gate 52 outputs the logical product of the outputs from the data output circuits 46 and 47 to the data output circuit 42. The AND gate 53 outputs the logical product of the outputs from the data output circuits 48 and 49 to the data output circuit 42. The data output circuit 42 determines whether or not the outputs from the AND gates 51 through 53 match with each other, and outputs the determination result as the output data DOUT.

Figure 2:
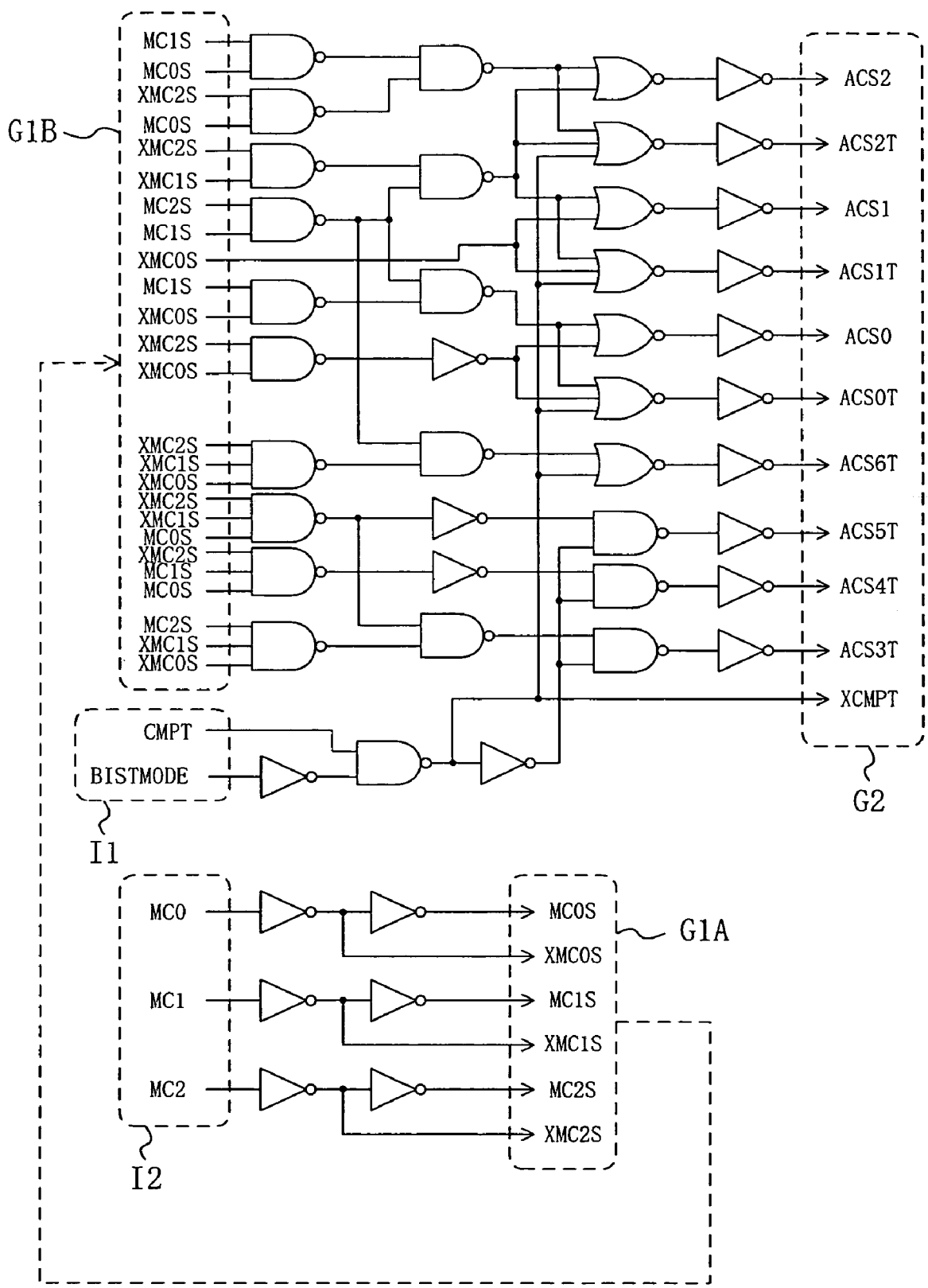
FIG. 2 is a circuit diagram illustrating an exemplary configuration of a first portion of a first memory macro control circuit of FIG. 1.
Figure 3:
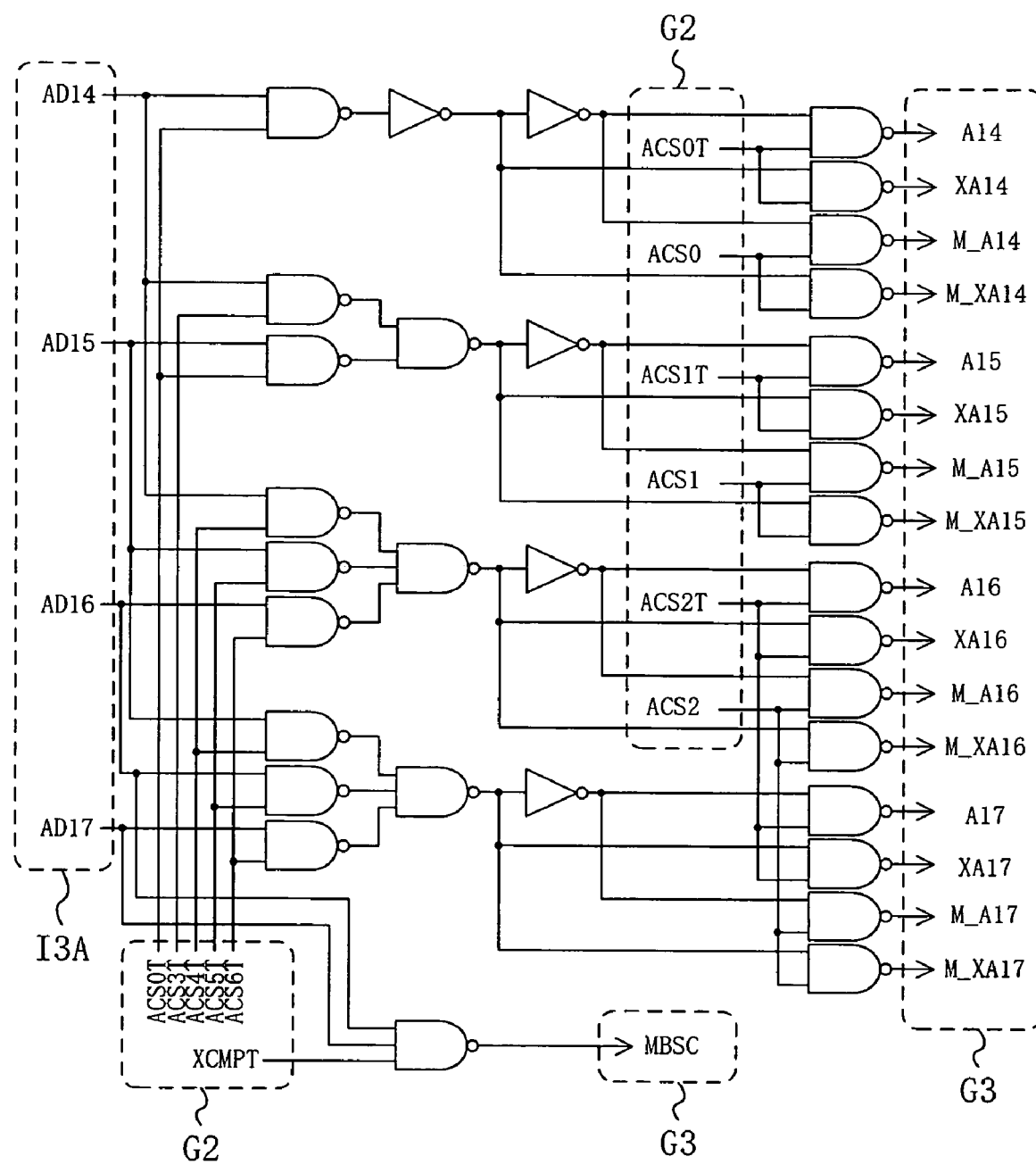
FIG. 3 is a circuit diagram illustrating an exemplary configuration of a second portion of the first memory macro control circuit of FIG. 1.
Figure 4:
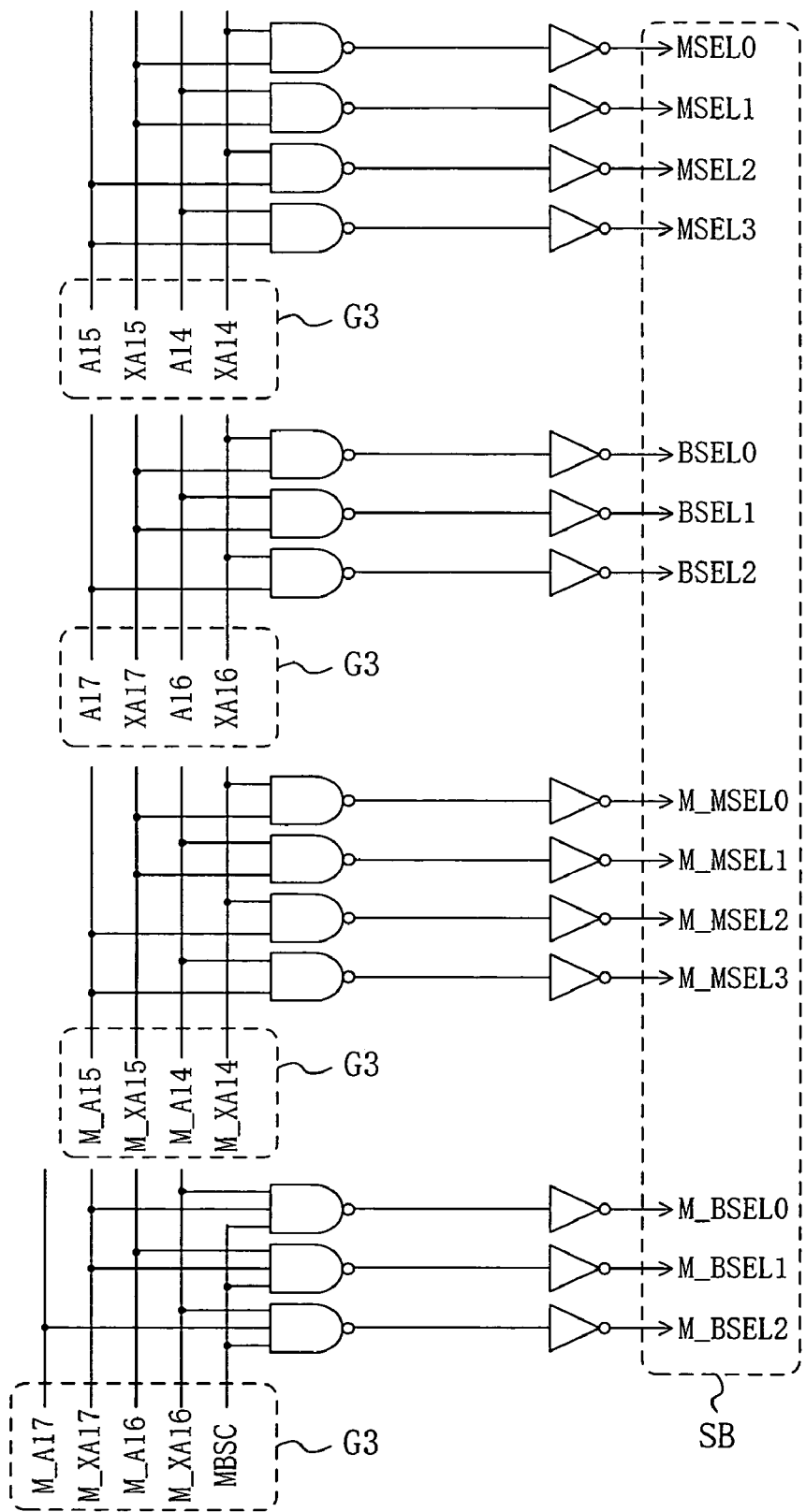
FIG. 4 is a circuit diagram illustrating an exemplary configuration of a third portion of the first memory macro control circuit of FIG. 1.

Next, the memory macro control circuit 32 of FIG. 1 will be discussed. FIGS. 2, 3, and 4 are circuit diagrams illustrating exemplary configurations of first, second and third portions of the first memory macro control circuit 32 of FIG. 1.

The circuit of FIG. 2 generates a signal G1A based on the active-macro-number designating signals MC0 through MC2 and uses this signal as a signal G1B. The circuit of FIG. 2 also generates a signal G2 based on the test mode designating signal CMPT, the test mode fixing signal BISTMODE and the signal G1B.

The circuit of FIG. 3 generates a signal G3 based on the memory macro selection address signal I3A contained in the input signal I3 and the signal G2. The memory macro selection address signal I3A contains signals AD14, AD15, AD16, and AD17. The signals AD14, AD15, AD16, and AD17 represent the bits of addresses used for selecting memory macros during normal operation, and this sequence is in order from a signal indicating a lower-order bit to a signal indicating a higher-order bit. The circuit of FIG. 4 generates and outputs the macro selection signal SB based on the signal G3.

Figure 5:
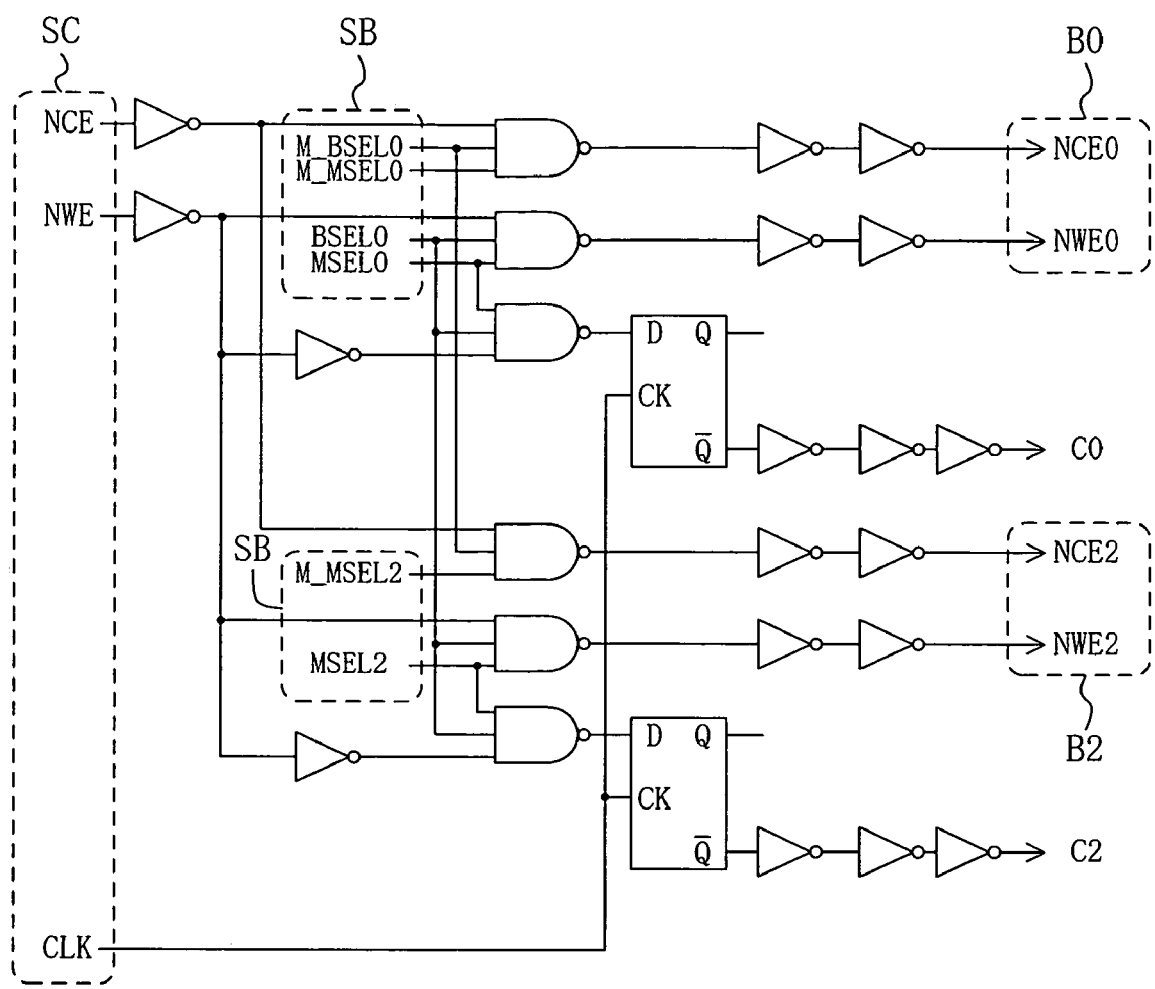
FIG. 5 is a circuit diagram illustrating an exemplary configuration of a second memory macro control circuit of FIG. 1.

FIG. 5 is a circuit diagram illustrating an exemplary configuration of the second memory macro control circuit 34 of FIG. 1. The memory macro control circuits 35 through 39 are configured in the same manner as the memory macro control circuit 34 except that their corresponding signals are input/output into/from them.

FIG. 6 is a view indicating relationship between the active-macro-number designating signals MC0 through MC2 and the number of memory macros that are activated simultaneously (the number of simultaneously activated macros.) As shown in FIG. 6, in the semiconductor device 100, the number of simultaneously activated macros can be set to any number of 1, 2, 3, 4, 6, and 12.

The memory macro control circuit 32 generates the macro selection signal SB so that the number of memory macros that corresponds to the active-macro-number designating signals MC0 through MC2 (that is, the second operation mode control signal I2) is activated at the same time. More specifically, the control unit 30 determines an operation mode that corresponds to the number of simultaneously activated memory macros as a second operation mode.

Figure 7:
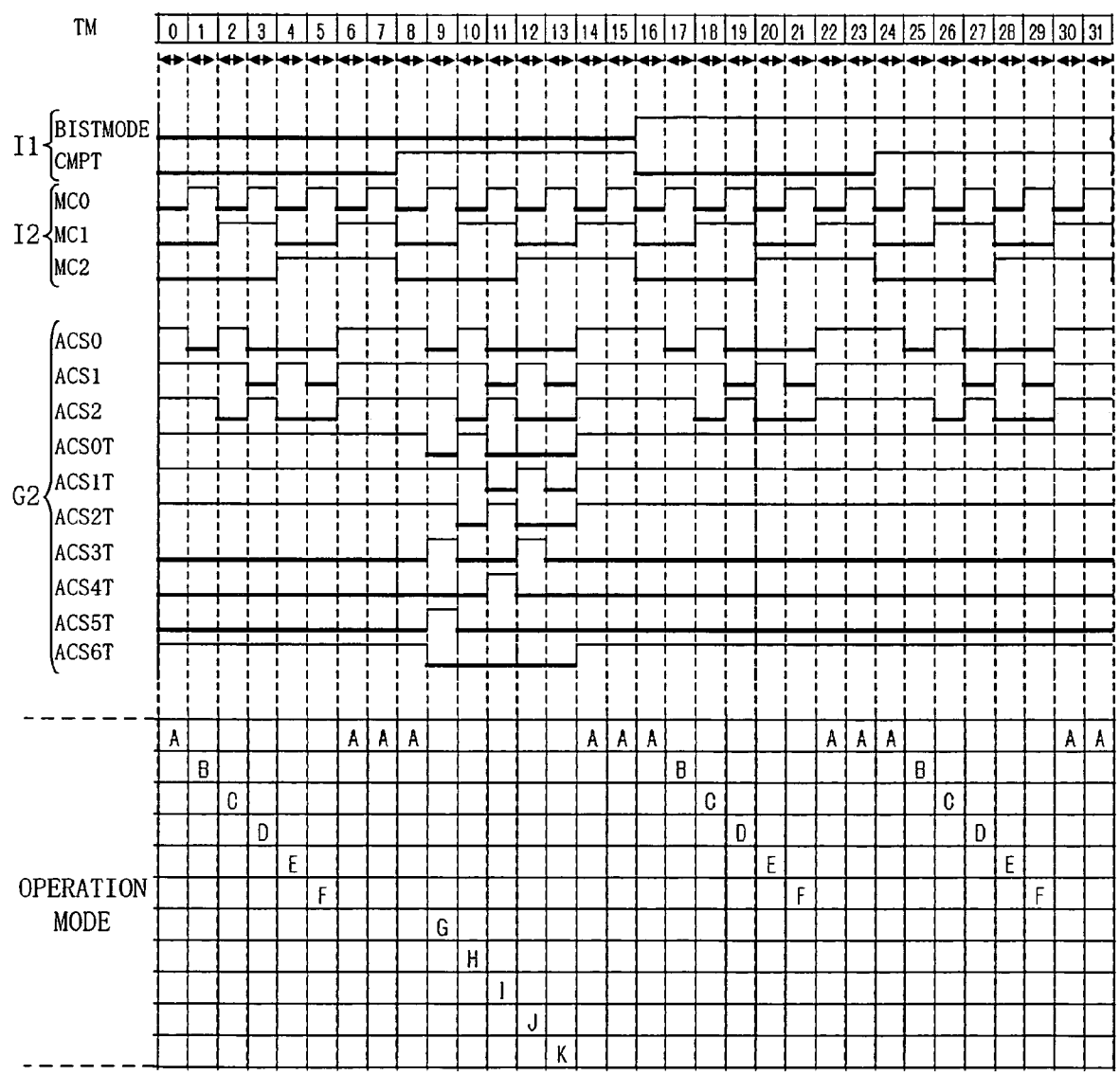
FIG. 7 is a logical chart indicating how the circuit of FIG. 2 operates.

FIG. 7 is a logical chart indicating how the circuit of FIG. 2 operates. FIG. 7 indicates logical states of signals contained in the signal G2 generated by the circuit of FIG. 2, with respect to all of the logical combinations (32 combinations in total) of the first and second operation mode control signals I1 and I2 (the test mode fixing signal BISTMODE, the test mode designating signal CMPT, and the active-macro-number designating signals MC0, MC1, and MC2) that are input into the memory macro control circuit 32.

Illustrated in the uppermost part of FIG. 7 are combination numbers TM (0 through 31) given to the respective combinations of the first and second operation mode control signals I1 and I2. The control unit 30 determines an operation mode of the entire semiconductor device 100 for each of these combinations. More specifically, the circuit of FIG. 2 outputs the signal G2 for making the semiconductor device 100 operate in any one of operation modes A, B, C, D, E, F, G, H, I, J, and K.

As described above, any one of the eleven operation modes A through K can be set as an operation mode of the entire semiconductor device 100. The operation mode A is a reference operation mode, and the semiconductor device 100 under normal usage operates in this mode. In the operation mode at the time of the normal usage, only one of the memory macros is activated. In the case of FIG. 7, the operation mode of the entire semiconductor device 100 is set to the operation mode A in 12 combinations of the 32 combinations of the five signals contained in the first and second operation mode control signals I1 and I2.

Figure 8:
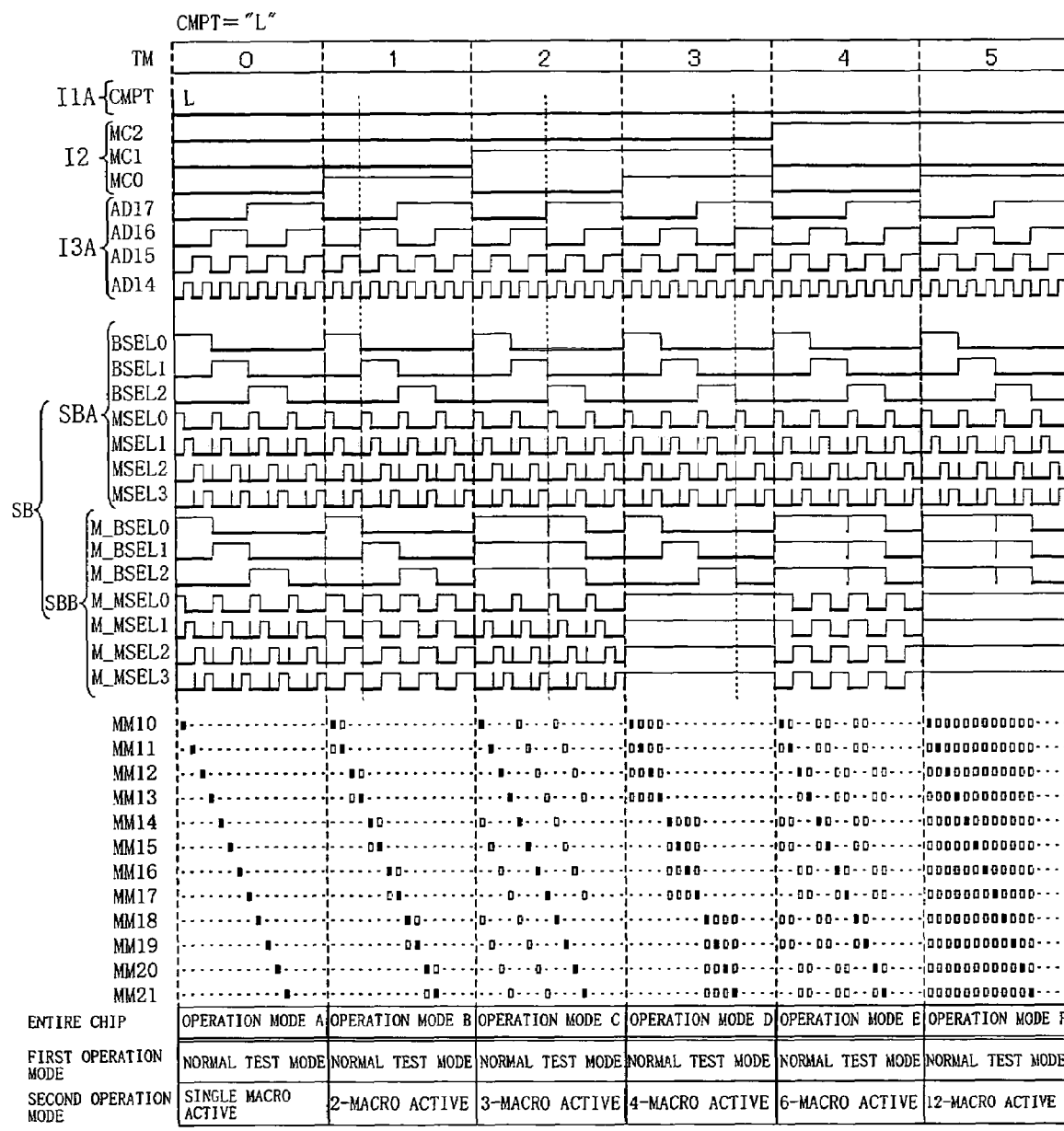
FIG. 8 is a logic chart indicating how the first memory macro control circuit of FIG. 1 operates in a normal test mode.

FIG. 8 is a logic chart indicating how the first memory macro control circuit 32 of FIG. 1 operates in the normal test mode. The logic chart of FIG. 8 corresponds to the cases of the combination numbers TM of 0 through 5 in the logic chart of FIG. 7. In FIG. 8, the test mode designating signal CMPT is fixed at the "L" level, and the test mode fixing signal BISTMODE is fixed at the "L" level.

FIG. 8 indicates the states of the macro selection signal SB and memory macros (MM) 10 through 21 with respect to the logical combinations of the test mode designating signal CMPT, second operation mode control signal I2, and memory macro selection address signal I3A. In this figure and a subsequent figure, black rectangles indicate memory macros which operate in the regular active mode, white rectangles indicate memory macros which operate in the dummy active mode, and marks "–" indicate memory macros which are non-active.

The macro selection signal SB contains a regular-mode active macro selection signal SBA for selecting memory macro(s) (regular-mode active memory macro(s)) that operate in the regular active mode, and a simultaneously active macro selection signal SBB for selecting memory macros (simultaneously active memory macros) that are activated at the same time irrespective of whether they operate in the regular active mode or the dummy active mode. Those memory macros which are selected by the simultaneously active macro selection signal SBB and not selected by the regular-mode active macro selection signal SBA operate in the dummy active mode.

FIG. 9 is a view illustrating combinations of the regular-mode active macro selection signal SBA and the simultaneously active macro selection signal SBB that correspond to the respective memory macros. FIG. 9 indicates that, for example, the memory macro 12 is selected as the regular-mode active memory macro when signals BSEL0 and MSEL2 are at the "H" level, while the memory macro 12 is selected as the simultaneously active memory macro when signals M_BSEL0 and M_MSEL2 are at the "H" level.

In FIG. 8, the operation mode of the entire semiconductor device 100 and the first and second operation modes are indicated for each combination number TM. The first operation mode is the normal test mode whenever the combination number TM is any number 0 through 5. In the cases of the combination numbers TM of 0, 1, 2, 3, 4, and 5, the second operation mode is a single macro active mode, a 2-macro simultaneously active mode, a 3-macro simultaneously active mode, a 4-macro simultaneously active mode, a 6-macro simultaneously active mode, and a 12-macro simultaneously active mode, respectively. The control unit 30 determines the operation modes of the entire semiconductor device 100 in accordance with the respective combinations of the first and second operation modes. In the cases of the combination numbers TM of 0, 1, 2, 3, 4, and 5, the operation mode of the entire semiconductor device 100 is set to the operation modes A, B, C, D, E, and F, respectively.

For example, in the case of the combination number TM of 2, the first operation mode is the normal test mode, the second operation mode is the 3-macro simultaneously active mode, and the operation mode of the entire semiconductor device 100 is the operation mode C. In this case, if all of the signals AD14 through AD17 included in the memory macro selection address signal I3A are at the "L" level, of the signals contained in the regular-mode active macro selection signal SBA, the signals BSEL0 and MSEL0 are put to the "H" level. In this case, the memory macro 10 becomes the regular-mode active memory macro in accordance with FIG. 9.

Also, of the signals included in the simultaneously active macro selection signal SBB, the signals M_BSEL0, M_BSEL1, M_BSEL2, and M_MSEL0 are put to the "H" level. In this case, the three memory macros 10, 14, and 18 become the simultaneously active memory macros in accordance with FIG. 9. Those memory macros that are selected as the simultaneously active memory macros and not selected as the regular-mode active memory macros are the dummy active memory macros, and the memory macros 14 and 18 are thus the dummy active memory macros in this case.

Figure 10:
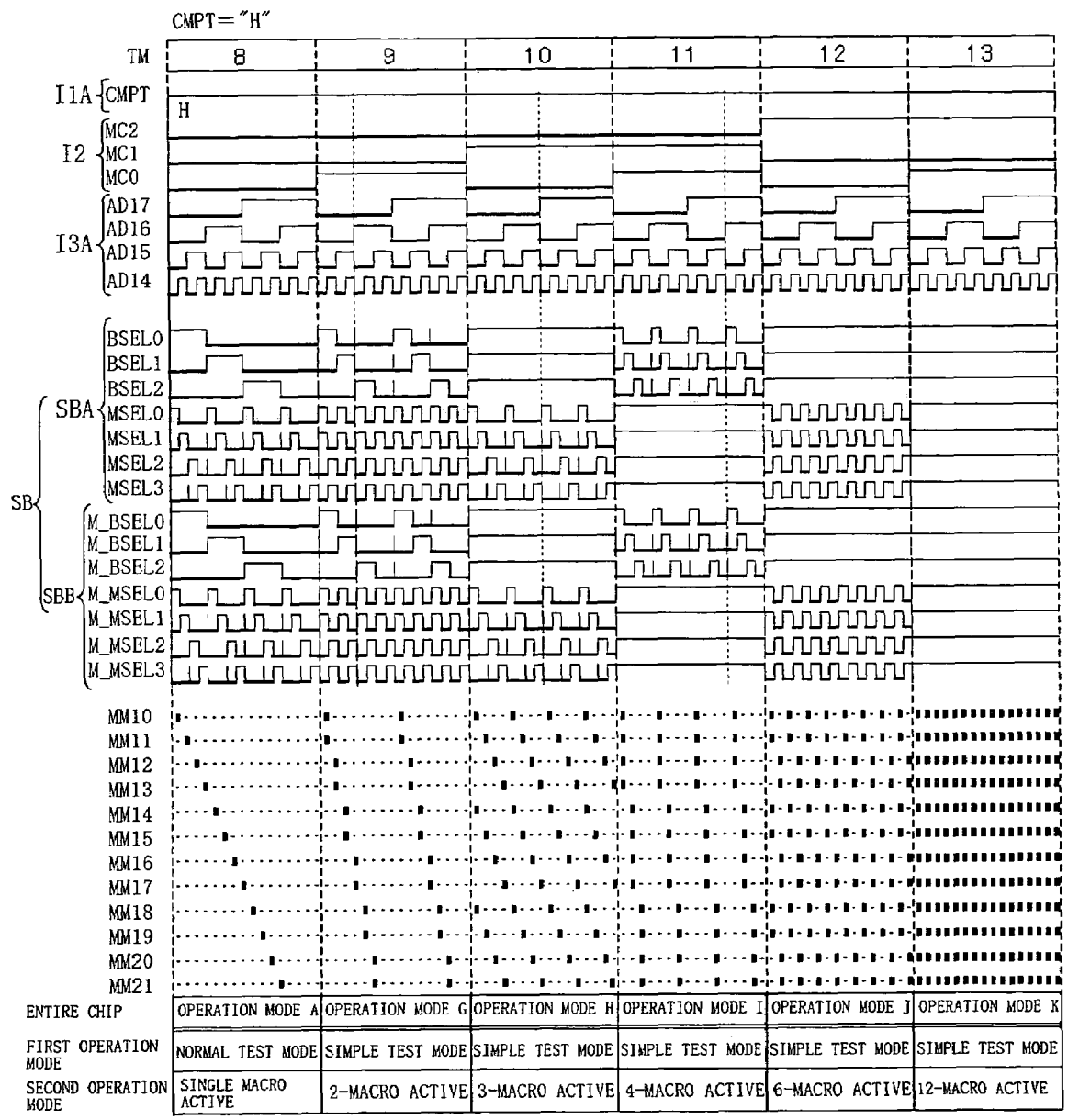
FIG. 10 is a logic chart indicating how the first memory macro control circuit of FIG. 1 operates in a simple test mode.

FIG. 10 is a logic chart indicating how the first memory macro control circuit 32 of FIG. 1 operates in the simple test mode. The logic chart of FIG. 10 corresponds to the cases of the combination numbers TM of 8 through 13 in the logic chart of FIG. 7. In FIG. 10, the test mode designating signal CMPT is fixed at the "H" level. The test mode fixing signal BISTMODE is fixed at the "L" level. Like FIG. 8, FIG. 10 indicates the states of the macro selection signal SB and memory macros 10 through 21 with respect to the logical combinations of the test mode designating signal CMPT, second operation mode control signal I2, and memory macro selection address signal I3A.

In FIG. 10, the operation mode of the entire semiconductor device 100 and the first and second operation modes are indicated for each combination number TM. The first operation mode is the normal test mode in the case of the combination number TM of 8, while the first operation mode is the simple test mode in the cases of the combination numbers TM of 9 through 13. In the cases of the combination numbers TM of 8, 9, 10, 11, 12, and 13, the second operation mode is the single-macro active mode, the 2-macro simultaneously active mod, the 3-macro simultaneously active mode, the 4-macro simultaneously active mode, the 6-macro simultaneously active mode, and the 12-macro simultaneously active mode, respectively. The control unit 30 determines the operation modes of the entire semiconductor device 100 in accordance with the respective combinations of the first and second operation modes. In the cases of the combination numbers TM of 8, 9, 10, 11, 12, and 13, the operation mode of the entire semiconductor device 100 is put to the operation modes A, G, H, I, J and K, respectively.

For example, in the case of the combination number TM of 11, the first operation mode is the simple test mode, the second operation mode is the 4-macro simultaneously active mode, and the operation mode of the entire semiconductor device 100 is the operation mode I. In this case, if the signals AD14 and AD15 included in the memory macro selection address signal I3A are both at the "L" level, of the signals contained in the regular-mode active macro selection signal SBA, the signals BSEL0, MSEL0, MSEL1, MSEL2, and MSEL3 are put to the "H" level. In this case, the memory macros 10, 11, 12, and 13 become the regular-mode active memory macros in accordance with FIG. 9. This is true irrespective of which signal level the signals AD16 and AD17 are at.

Also, of the signals included in the simultaneously active macro selection signal SBB, the signals M_BSEL0, M_MSEL0, M_MSEL1, M_MSEL2, and M_MSEL3 are put to the "H" level. In this case, the four memory macros 10, 11, 12, and 13 become the simultaneously active memory macros in accordance with FIG. 9. In this case, no dummy active memory macros exist and all of the simultaneously active memory macros become the regular-mode active memory macros.

In the simple test mode in which two or more of the memory macros become the regular-mode active memory macros at the same time, the control unit 30 generates the macro selection signal SB without using (in other words, by invalidating) part of the signals AD14 through AD17 that form the memory macro selection address signal I3A, selects that two or more memory macros in accordance with this, and controls their operation mode.

More specifically, the control unit 30 does not use the signal AD17 in the operation mode G that is the 2-macro simultaneously active mode, and does not use the signals AD17 and AD16 in the operation mode H that is the 3-macro simultaneously active mode and in the operation mode I that is the 4-macro simultaneously active mode. And the control unit 30 does not use the signals AD17, AD16, and AD15 in the operation mode J that is the 6-macro simultaneously active mode, and does not use any of the signals AD17, AD16, AD15 and AD14 in the operation mode K that is the 12-macro simultaneously active mode.

As described above, as the number of simultaneously activated memory macros increases, the number of signals that are not used rises. The control unit 30 selects some of the signals forming the memory macro selection address signal I3A from the highest toward lowest order, generates the macro selection signal SB based on signals that were not selected, and selects two or more of the memory macros to be activated in accordance with this.

Figure 11:
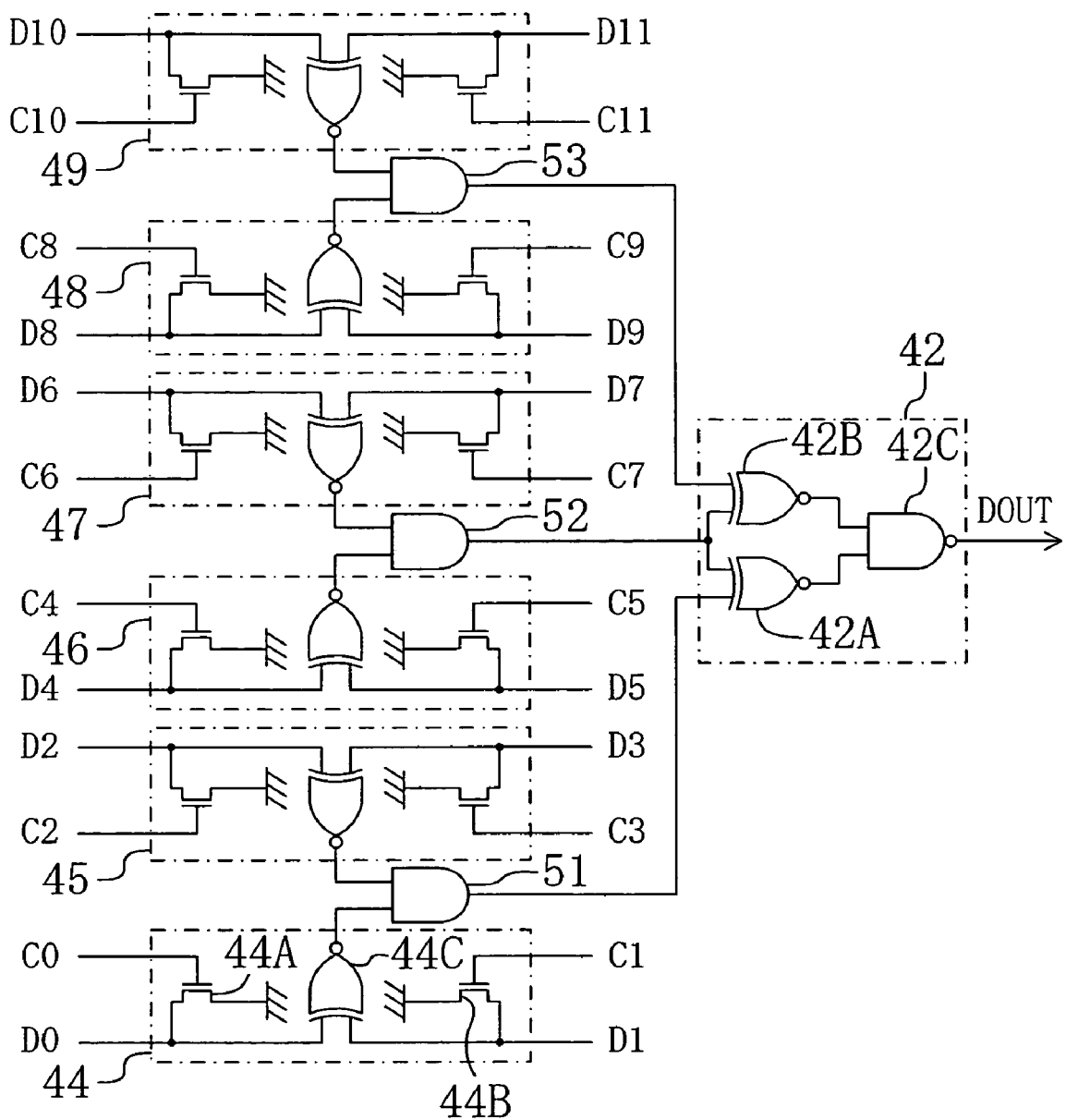
FIG. 11 is a circuit diagram illustrating an exemplary configuration of an output data transmitting unit of FIG. 1.
Figure 12:
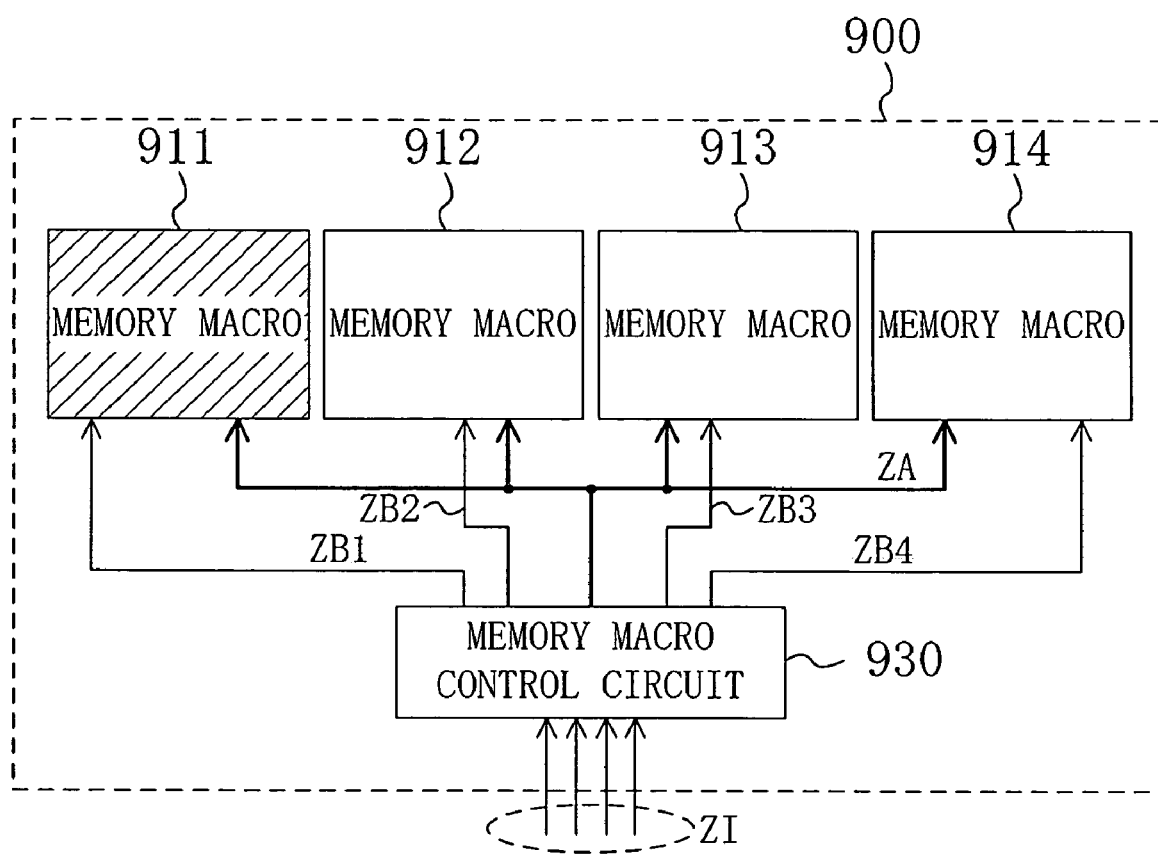
FIG. 12 is a block diagram illustrating an exemplary configuration of a conventional semiconductor device.

FIG. 11 is a circuit diagram illustrating an exemplary configuration of the output data transmitting unit of FIG. 1. The first data output circuit 44 includes NMOS transistors 44A and 44B, and as a first match-determination circuit, an EXOR gate (exclusive or circuit) 44C whose output is inverted. The second data output circuit 42 includes, as second match-determination circuits, EXOR gates 42A and 42B whose output is inverted, and also includes an NAND gate 42C serving as a second AND circuit.

The output data transmitting unit selects a memory macro whose corresponding active mode control signal is at the "L" level, and obtains the output data DOUT based on data read out from that selected memory macro.

More specifically, when the memory macro 10 operates in the regular active mode, the corresponding active mode control signal C0 is at the "L" level, in which case data read out from the memory macro 10 is given as an output data D0 to the EXOR gate 44C. On the other hand, when the memory macro 10 operates in the dummy active mode or is non-active, the active mode control signal C0 is at the "H" level, in which case the NMOS transistor 44A puts the output D0 produced from the memory macro 10 to the "L" level. In other words, the data read out from the memory macro 10 is not used in the EXOR gate 44C. This holds true with respect to the other memory macros 11 through 21.

Therefore, the data output circuit 44 supplies an "H"-level output to the AND gate 51 when neither of the memory macros 10 and 11 operates in the regular active mode. When only one of the memory macros 10 and 11 operates in the regular active mode, the data output circuit 44 inverts an output produced from the memory macro that operates in the regular active mode, and gives the inverted output to the AND gate 51. And when the memory macros 10 and 11 both operate in the regular active mode, the data output circuit 44 supplies an "H"-level output to the AND gate 51 if the outputs D0 and D1 produced from the respective memory macros 10 and 11 match with each other, and the data output circuit 44 gives an "L"-level output to the AND gate 51 if the outputs D0 and D1 do not match with each other.

The data output circuits 45 through 49, which are configured in the same manner as the data output circuit 44, operate similarly in accordance with the corresponding active mode control signals and outputs produced from the corresponding memory macros, and supply their output to the AND gates 51 through 53.

The data output circuit 42 determines whether or not logical states of three signals output from the AND gates 51 through 53 match with each other, and outputs the determination result. More specifically, the outputs from the AND gates 51 and 53 are supplied to the EXOR gates 42A and 42B, respectively, while the output from the AND gate 52 is provided to the EXOR gates 42A and 42B. The NAND gate 42C obtains the logical product of outputs produced from the EXOR gates 42A and 42B to output the obtained logical product as the output data DOUT.

As described above, in the normal test mode, the output data transmitting unit of FIG. 1 obtains and outputs the output data DOUT based on data read out from one of the memory macros that operates in the regular active mode. It is thus possible to perform a failure/non-failure determination for each memory macro.

In the simple test mode, the output data transmitting unit obtains and outputs as the output data DOUT a signal indicating whether or not data bits read out from two or more of the memory macros that operate in the regular active mode all match with each other. It is thus possible to determine whether or not the two or more memory macros that operate in the regular active mode all function properly.

As described above, in the semiconductor device of FIG. 1, selected two or more memory macros can be simultaneously activated to be subjected to a burn-in process, a failure/non-failure determination process and the like. Therefore, time required for the test and the like is reduced as compared with cases in which memory macros are activated one by one.

The inventive semiconductor device whose test time, for example, can be reduced functions effectively as a semiconductor device that has a plurality of memory macros each including a plurality of memory cells.

What is claimed is:

1. A semiconductor device comprising:
   a plurality of memory macros, each of which includes a plurality of memory cells, is activated in accordance with a corresponding active macro selection signal, and operates in an active mode according to a corresponding active mode control signal; and a control unit configured to generate and output, in accordance with an input operation mode control signal, the active macro selection signals and the active mode control signals that correspond to the respective memory macros, so that any one of the memory macros operates in a regular active mode performing a normal operation, and another one or more of the memory macros simultaneously operate together with the any one of the memory macros in a dummy active mode in which read data is not output externally of the memory macros.

2. The device of claim 1, wherein the control unit determines a test mode of the semiconductor device as a first operation mode in accordance with the operation mode control signal.

3. The device of claim 1, wherein the control unit determines, in accordance with the operation mode control signal, an operation mode that corresponds to the number of the simultaneously activated memory macros, as a second operation mode.

4. The device of claim 1, wherein a first operation mode control signal that indicates a test mode and a second operation mode control signal that indicates the number of memory macros to be activated simultaneously are input as the operation mode control signal into the control unit; and the control unit determines a test mode of the semiconductor device as a first operation mode in accordance with the first operation mode control signal, determines, in accordance with the second operation mode control signal, an operation mode that corresponds to the number of the simultaneously activated memory macros, as a second operation mode, and determines an operation mode of the entire semiconductor device based on a combination of the first and second operation modes.

5. The device of claim 4, wherein, some of logical combinations that the first and second operation mode control signals indicate correspond as the operation mode of the entire semiconductor device to a given reference operation mode.

6. The device of claim 5, wherein the reference operation mode is an operation mode in which the semiconductor device under normal usage operates.

7. The device of claim 4, further comprising an output data transmitting unit for obtaining and outputting output data that corresponds to the first operation mode, based on data read out from one or more of the plurality of memory macros.

8. The device of claim 7, wherein the output data transmitting unit obtains the output data in accordance with the first operation mode, based on data that indicates whether or not data bits read out from two or more of the plurality of memory macros all match with each other, or based on a data bit read out from one of the plurality of memory macros.

9. The device of claim 8, wherein the output data transmitting unit includes a plurality of stages of match determination circuits, in which the match determination circuits each determine whether or not data bits input therein match with each other.

10. The device of claim 9, wherein the output data transmitting unit includes, as the match determination circuits, a plurality of first match determination circuits and a plurality of second match determination circuits;

the output data transmitting unit further includes a plurality of first AND circuits and a second AND circuit;

each of the first match determination circuits determines whether or not data bits output from corresponding memory macros of the plurality of memory macros match with each other, and outputs a result of the determination;

each of the first AND circuits obtains and outputs a logical product of the outputs produced from corresponding first match determination circuits of the plurality of first match determination circuits;

each of the second match determination circuits determines whether or not the outputs produced from corresponding first AND circuits of the plurality of first AND circuits match with each other, and outputs a result of the determination; and the second AND circuit obtains a logical product of the outputs produced from the second match determination circuits and outputs the logical product as the output data.

11. The device of claim 10, wherein the first match determination circuits use the outputs produced respectively from the memory macros of the plurality of memory macros that correspond to the first match determination circuits, in accordance with the active mode control signals that correspond to the respective memory macros.

12. The device of claim 8, wherein the output data transmitting unit obtains the output data based on one or more data bits read out from one or more memory macros each of which has been selected by a corresponding one of the active mode control signals from the plurality of memory macros.

13. The device of claim 8, wherein the output data transmitting unit includes a data output circuit for determining whether or not logical states of three or more signals match with each other and outputting a result of the determination;

the data output circuit includes a plurality of two-input match determination circuits, each of which determines whether or not logical states of two signals match with each other and outputs a result of the determination; and signals that are in an identical logical state are input into two of the two-input match determination circuits.

14. The device of claim 13, wherein the two-input match determination circuits are exclusive OR circuits.

15. A semiconductor device comprising:

a plurality of memory macros, each of which includes a plurality of memory cells, is activated in accordance with a corresponding active macro selection signal, and operates in an active mode according to a corresponding active mode control signal; and a control unit for generating and outputting, in accordance with an input operation mode control signal, the active macro selection signals and the active mode control signals that correspond to the respective memory macros, so that two or more of the memory macros are activated simultaneously, wherein in activating the simultaneously activated memory macros in an identical active mode, the control unit selects the simultaneously activated memory macros based on, of all signals that form a memory macro selection address signal used for memory macro selection, one or more signals other than signals that have been selected from the highest toward lowest order by the number corresponding to the number of the simultaneously activated memory macros.

* * * * *